(12) United States Patent
Li

(10) Patent No.: US 12,424,129 B2
(45) Date of Patent: Sep. 23, 2025

(54) DISPLAY PANEL, DISPLAY PANEL TEST METHOD, AND DISPLAY DEVICE

(71) Applicant: SHENZHEN CHINA STAR OPTOELECTRONICS SEMICONDUCTOR DISPLAY TECHNOLOGY CO., LTD., Guangdong (CN)

(72) Inventor: Dongwei Li, Guangdong (CN)

(73) Assignee: SHENZHEN CHINA STAR OPTOELECTRONICS SEMICONDUCTOR DISPLAY TECHNOLOGY CO., LTD., Guangdong (CN)

(*) Notice: Subject to any disclaimer, the term of this patent is extended or adjusted under 35 U.S.C. 154(b) by 0 days.

(21) Appl. No.: 17/755,526

(22) PCT Filed: Apr. 18, 2022

(86) PCT No.: PCT/CN2022/087419
§ 371 (c)(1),
(2) Date: Apr. 29, 2022

(87) PCT Pub. No.: WO2023/184615
PCT Pub. Date: Oct. 5, 2023

(65) Prior Publication Data
US 2024/0169868 A1    May 23, 2024

(30) Foreign Application Priority Data
Mar. 28, 2022   (CN) .......................... 202210315270.6

(51) Int. Cl.
G09G 3/00       (2006.01)
H10K 59/131     (2023.01)
H10K 59/35      (2023.01)

(52) U.S. Cl.
CPC .......... *G09G 3/006* (2013.01); *H10K 59/131* (2023.02); *G09G 2300/0452* (2013.01); *H10K 59/351* (2023.02)

(58) Field of Classification Search
CPC ........... G09G 3/006; G09G 2300/0452; H10K 59/131; H10K 59/351
See application file for complete search history.

(56) References Cited

U.S. PATENT DOCUMENTS

2006/0279322 A1*  12/2006  Lai .......................... G09G 3/006
                                                    324/760.02
2010/0127258 A1    5/2010  Kang et al.
(Continued)

FOREIGN PATENT DOCUMENTS

CN       102566169 A     7/2012
CN       104217672 A     12/2014
(Continued)

OTHER PUBLICATIONS

English Translation of CN 113223433 (Year: 2021).*
(Continued)

*Primary Examiner* — Patrick N Edouard
*Assistant Examiner* — Eboni N Giles
(74) *Attorney, Agent, or Firm* — PV IP PC; Wei Te Chung

(57) ABSTRACT

An embodiment of the present application provides a display panel, a display panel test method, and a display device. The display panel includes an underlay, signal lines and a first test module. The signal lines include first signal lines and second signal lines. The first signal lines are connected to first color pixels. The second signal lines are connected to second color pixels. first test module is disposed on underlay and are spaced from the signal lines. The first test module is connected to the first signal lines and the second signal lines.

17 Claims, 4 Drawing Sheets

(56) References Cited

U.S. PATENT DOCUMENTS

| | | | | |
|---|---|---|---|---|
| 2012/0169346 A1* | 7/2012 | Huang | ............... | G02F 1/1309 |
| | | | | 324/414 |
| 2018/0180959 A1* | 6/2018 | Gan | ............... | G02F 1/1368 |
| 2019/0025619 A1* | 1/2019 | Lv | ............... | H10D 86/60 |

FOREIGN PATENT DOCUMENTS

| | | | |
|---|---|---|---|
| CN | 104280908 A | 1/2015 |
| CN | 105652539 A | 6/2016 |
| CN | 105676497 A | 6/2016 |
| CN | 106531039 A | 3/2017 |
| CN | 107248387 A | 10/2017 |
| CN | 110349525 A | 10/2019 |
| CN | 112017543 A | 12/2020 |
| CN | 112289243 A | 1/2021 |
| CN | 113223433 A | 8/2021 |

OTHER PUBLICATIONS

International Search Report in International application No. PCT/CN2022/087419, mailed on Nov. 25, 2022.

Written Opinion of the International Search Authority in International application No. PCT/CN2022/087419, mailed on Nov. 25, 2022.

Chinese Office Action issued in corresponding Chinese Patent Application No. 202210315270.6 dated Aug. 24, 2024, pp. 1-8.

Chinese Office Action issued in corresponding Chinese Patent Application No. 202210315270.6 dated Mar. 7, 2025, pp. 1-8.

* cited by examiner

DISPLAY PANEL, DISPLAY PANEL TEST METHOD, AND DISPLAY DEVICE

FIELD OF INVENTION

The present application relates to a field of display technologies, particularly to a display panel, a display panel test method, and a display device.

BACKGROUND OF INVENTION

At present, during manufacturing processes of a large size active-matrix organic light-emitting diode semiconductor (AMOLED) display panel, corresponding inspection processes are required respectively after an array module process, an electroluminescence (EL) module process, and an encapsulation process. At present, two common inspection ways are after the array module process:

A first array test is using a probe contact method of full contact for inspection. Such inspection method has a high accuracy. However, it requires each of signal lines to connect with a probe of an inspection apparatus mechanism such that requirements of alignment precision and mechanism design of the inspection apparatus probe is very high and a risk of missing probe contact is also high. Furthermore, to fulfill different display panel lines, a probe design compatibility of the inspection apparatus also requires an addition design. A second array test method connects array test soldering pads on a display panel to display panel test soldering pads also on the display panel, and an inspection apparatus probe can inspect defects of an array region without a full contact method. However, such inspection method still requires three R/G/B probes corresponding to data signal lines. Therefore, it still has a high demand to an amount of aligned probes of inspection apparatus.

During research and practice of the conventional technologies, the inventor of the present application has discovered that a common inspection has a lower inspection accuracy.

SUMMARY OF INVENTION

Technical Issue

An embodiment of the present application provides a display panel, a display panel test method, and a display device that are able to improve precision of inspection.

Technical Solution

An embodiment of the present application provides a display panel, the display panel includes first color pixels and second color pixels, and the display panel includes:
  an underlay;
  signal lines disposed on the underlay, wherein the signal lines include a plurality of first signal lines and a plurality of second signal lines, the first signal lines are connected to the first color pixels, and the second signal lines are connected to the second color pixels; and
  a first test module disposed on the underlay, wherein the first test module includes a first shorting bar and a first soldering pad, an end of the first shorting bar is connected to the first signal lines and the second signal lines, another end of the first shorting bar is connected to the first soldering pad, and the first test module is configured for an array test of the display panel.

Optionally, in some embodiments of the present application, the display panel further includes third color pixels, the signal lines further include a plurality of third signal lines, the third signal lines are connected to the third color pixels, and the first shorting bar is further connected to the third signal lines.

Optionally, in some embodiments of the present application, the display panel further includes a control module, the control module is connected to the first signal lines, the second signal lines and the third signal lines, the control module is configured to control switching on/off of the first signal lines, the second signal lines, and the third signal lines.

Optionally, in some embodiments of the present application, the control module includes a first thin film transistor, a second thin film transistor, and a third thin film transistor; and
  a gate electrode of the first thin film transistor is configured to receive a first trigger signal, a source electrode and a drain electrode of the first thin film transistor are connected to the first signal lines, a gate electrode of the second thin film transistor is configured to receive a second trigger signal, a source electrode and a drain electrode of the second thin film transistor are connected to the second signal lines, a gate electrode of the third thin film transistor is configured to receive a third trigger signal, and a source electrode and a drain electrode of the third thin film transistor are connected to the third signal lines.

Optionally, in some embodiments of the present application, the display panel further includes second test module, the second test module is disposed on the underlay and is disposed at an interval from the first test module, the second test module includes a first color shorting bar, a first color test soldering pad, a second color shorting bar, and a second color test soldering pad, an end of the first color shorting bar is electrically connected to the first signal lines, another end of the first color shorting bar is connected to the first color test soldering pad, an end of the second color shorting bar is electrically connected to the second signal lines, another end of the second color shorting bar is connected to the second color test soldering pad, and the first test module is disposed on a side of the second test module away from the first color pixels and the second color pixels.

Optionally, in some embodiments of the present application, the second test module further includes a third color shorting bar and a third color test soldering pad, an end of the third color shorting bar is electrically connected to the third signal lines, and another end of the third color shorting bar is connected to the third color test soldering pad.

Optionally, in some embodiments of the present application, the first color pixels are blue pixels, the second color pixels are red pixels, and the third color pixels are green pixels.

Optionally, in some embodiments of the present application, the first color pixels are red pixels, the second color pixels are green pixels, and the third color pixels are blue pixels.

Optionally, in some embodiments of the present application, the first color pixels are green pixels, the second color pixels are blue pixels, and the third color pixels are red pixels.

Optionally, in some embodiments of the present application, the display panel further includes third color pixels, the signal lines further include a plurality of third signal lines, the third signal lines are connected to the third color pixels, the first test module further includes a second shorting bar and a second soldering pad, an end of the second shorting bar is connected to the third signal lines, and another end of the second shorting bar is connected to the second soldering pad.

Accordingly, the embodiment of the present application also provides a display panel test method, configured to test any one of the above display panels, wherein the display panel test method includes: implementing an array test to the display panel by an array test soldering pad in the first test module.

Accordingly, the embodiment of the present application also provides a display device, including a display panel and an encapsulation structure, wherein the display panel is the display panel according to claim 1, and the encapsulation structure is disposed on the display panel.

Optionally, in some embodiments of the present application, the display panel further includes third color pixels, the signal lines further include a plurality of third signal lines, the third signal lines are connected to the third color pixels, and the first shorting bar is further connected to the third signal lines.

Optionally, in some embodiments of the present application, the display panel further includes a control module, the control module is connected to the first signal lines, the second signal lines and the third signal lines, the control module is configured to control switching on/off of the first signal lines, the second signal lines, and the third signal lines.

Optionally, in some embodiments of the present application, the control module includes a first thin film transistor, a second thin film transistor, and a third thin film transistor; and a gate electrode of the first thin film transistor is configured to receive a first trigger signal, a source electrode and a drain electrode of the first thin film transistor are connected to the first signal lines, a gate electrode of the second thin film transistor is configured to receive a second trigger signal, a source electrode and a drain electrode of the second thin film transistor are connected to the second signal lines, a gate electrode of the third thin film transistor is configured to receive a third trigger signal, and a source electrode and a drain electrode of the third thin film transistor are connected to the third signal lines.

Optionally, in some embodiments of the present application, the display panel further includes second test module, the second test module is disposed on the underlay and is disposed at an interval from the first test module, the second test module includes a first color shorting bar, a first color test soldering pad, a second color shorting bar, and a second color test soldering pad, an end of the first color shorting bar is electrically connected to the first signal lines, another end of the first color shorting bar is connected to the first color test soldering pad, an end of the second color shorting bar is electrically connected to the second signal lines, another end of the second color shorting bar is connected to the second color test soldering pad, and the first test module is disposed on a side of the second test module away from the first color pixels and the second color pixels.

Optionally, in some embodiments of the present application, the second test module further includes a third color shorting bar and a third color test soldering pad, an end of the third color shorting bar is electrically connected to the third signal lines, and another end of the third color shorting bar is connected to the third color test soldering pad.

Optionally, in some embodiments of the present application, the first color pixels are blue pixels, the second color pixels are red pixels, and the third color pixels are green pixels.

Optionally, in some embodiments of the present application, the first color pixels are red pixels, the second color pixels are green pixels, and the third color pixels are blue pixels.

Optionally, in some embodiments of the present application, the display panel further includes third color pixels, the signal lines further include a plurality of third signal lines, the third signal lines are connected to the third color pixels, the first test module further includes a second shorting bar and a second soldering pad, an end of the second shorting bar is connected to the third signal lines, and another end of the second shorting bar is connected to the second soldering pad.

Advantages

The embodiment of the present application discloses a display panel, a display panel test method, and a display device. The display device includes a display panel. The display panel includes an underlay, signal lines, a first test module, and a second test module. The signal lines are disposed on underlay. The signal lines include a plurality of first signal lines and a plurality of second signal lines. The first signal lines are connected to first color pixels. The second signal lines are connected to second color pixels. The first test module is disposed on underlay and is spaced from the signal lines. The first test module is connected to the first signal lines and the second signal lines. Because the first test module is connected to the first signal lines and the second signal lines, the first signal lines and the second signal lines need no individual test when an array test is implemented. Thus, a number of probes of the array inspection apparatus can be reduced, and requirement for alignment between test probes and the test module can be lowered, which prevents inaccuracy of the array inspection.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may also acquire other figures according to the appended figures without any creative effort.

DETAILED DESCRIPTION OF PREFERRED EMBODIMENTS

Figure 1:
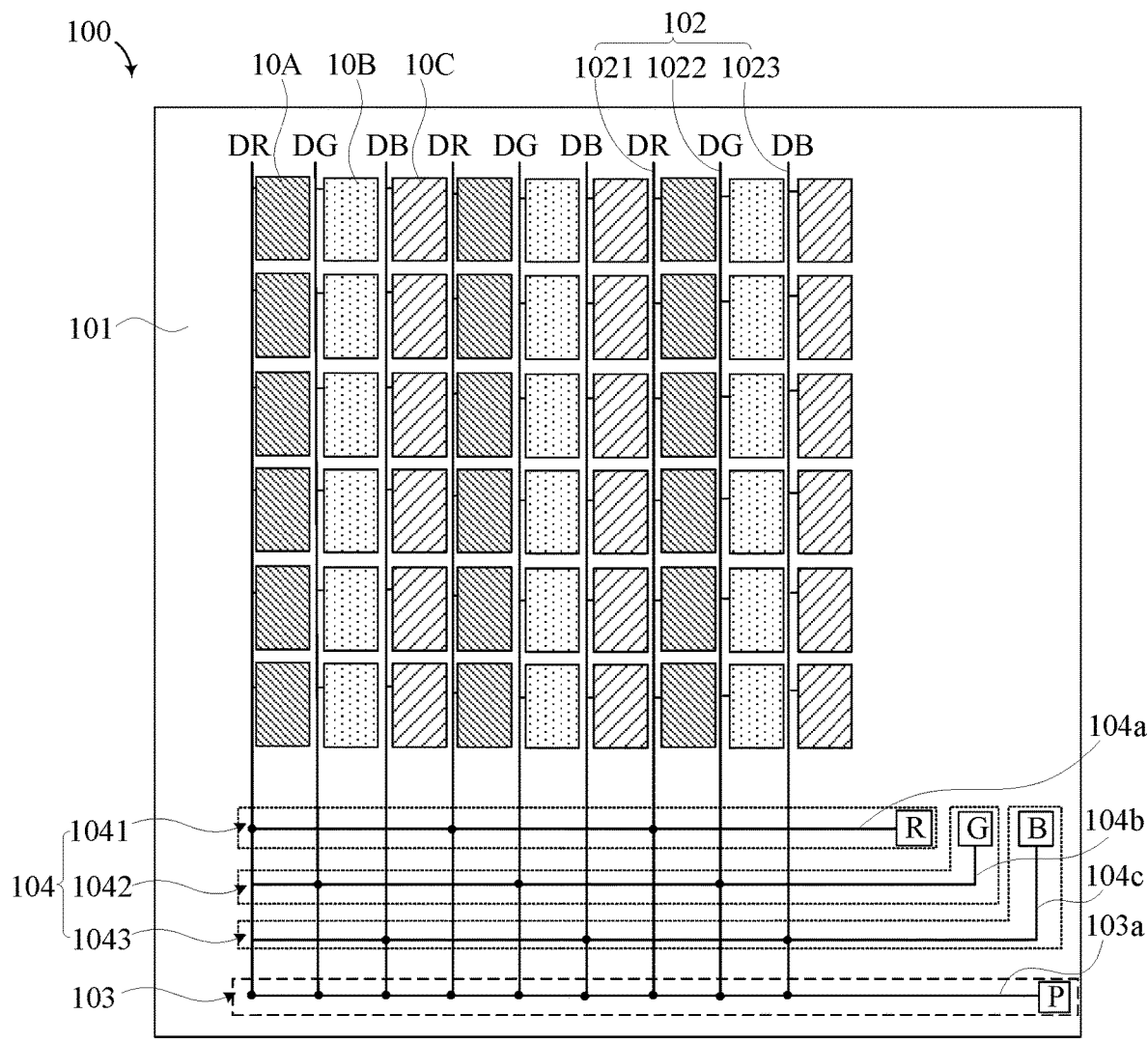
FIG. 1 is a first schematic structural view of a display panel provided by an embodiment of the present application.

The technical solution in the embodiment of the present application will be clearly and completely described below with reference to the accompanying drawings in the embodiments of the present application. Apparently, the described embodiments are merely some embodiments of the present application instead of all embodiments. According to the embodiments in the present application, all other embodiments obtained by those skilled in the art without making any creative effort shall fall within the protection scope of the present application. In addition, it should be understood that the specific embodiments described here are only used to illustrate and explain the present application, and are not used to limit the present application. In the present application, the used orientation terminologies such as "upper" and "lower", when not specified to the contrary explanation, usually refer to the upper and lower states of the device in actual use or working conditions, specifically according to the direction of the figures in the drawings. Furthermore, "inner" and "outer" refer to the outline of the device.

The embodiment of the present application provides a display panel, a display panel test method, and a display device that are described respectively as follows. It should be explained that a description order of the following embodiments is not a limit to a preferred order of the embodiments.

With reference to FIG. 1, FIG. 1 is a first schematic structural view of a display panel provided by an embodiment of the present application. A display panel 100 provided by the embodiment of the present application includes first color pixels 10A and second color pixels 10B. the display panel 100 includes an underlay 101, signal lines 102, and a first test module 103. The signal lines 102 are disposed on the underlay 101. The signal lines 102 include a plurality of first signal lines 1021 and a plurality of second signal lines 1022. The first signal lines 1021 are connected to the first color pixels 10A. The second signal lines 1022 are connected to the second color pixels 10B. The first test module 103 is disposed on the underlay 101. The first test module 103 includes the first shorting bar 103a and a first soldering pad P. The first soldering pad P is connected to the first signal lines 1021 and the second signal lines 1022.

The embodiment of the present application provides the display panel 100. The first test module 103 is disposed on the display panel 100. Because the first test module 103 is connected to the first signal lines 1021 and the second signal lines 1022, the first signal lines 1021 and the second signal lines 1022 requires no individual test when an array test (AT) is implemented. As such, a number of probes of an AT inspection apparatus can be reduced and requirement for test probes and the test module can be lowered, which prevents inaccuracy of the AT inspection.

To achieve an objective of compatibility and fast inspection of an inspection apparatus, the first soldering pad P connects all signal lines. For example, data lines are connected on a periphery of the substrate. Such design requires no accurate alignment of each line when an AT apparatus implements inspection but only needs a contact with has a larger test module.

It can be understood that in the embodiment of the present application the signal lines can be various signal lines on the display panel 100 required to receive inspection, for example, data lines or test lines. The present application has no limit to types of signal lines.

It should be explained that in the embodiment of the present application the first soldering pad P is simultaneously connected to the first signal lines 1021 and the second signal lines 1022, which can save some disposing space of the first soldering pad P compared to individual connection with the first signal lines 1021 and the second signal lines 1022. Therefore, a size of the first soldering pad P can be increased to simultaneously connect the first signal lines 1021 and the second signal lines 1022 to the same first soldering pad P. Alternatively, a connection line is used to connect the first signal lines 1021, a connection line is used to connect the second signal lines 1022. Then, the connection lines are simultaneously connected to the same first soldering pad P.

The display panel 100 provided by the embodiment of the present application can be a display panel with two color pixels mixing colors. For example, the first color pixels are yellow pixels, and the second color pixels are blue pixels. Also for example, the first color pixels are purple pixels, and the second color pixels are green pixels. Alternatively, on a RGBW type display panel, the first color pixels are white pixels, and the second color pixels are one of red pixels, blue pixels, and green pixels.

The display panel 100 can also be a display panel with three color pixels mixing colors for display. For example, the first color pixels are red pixels, the second color pixels are blue pixels, and the third color pixels are green pixels.

Figure 2:
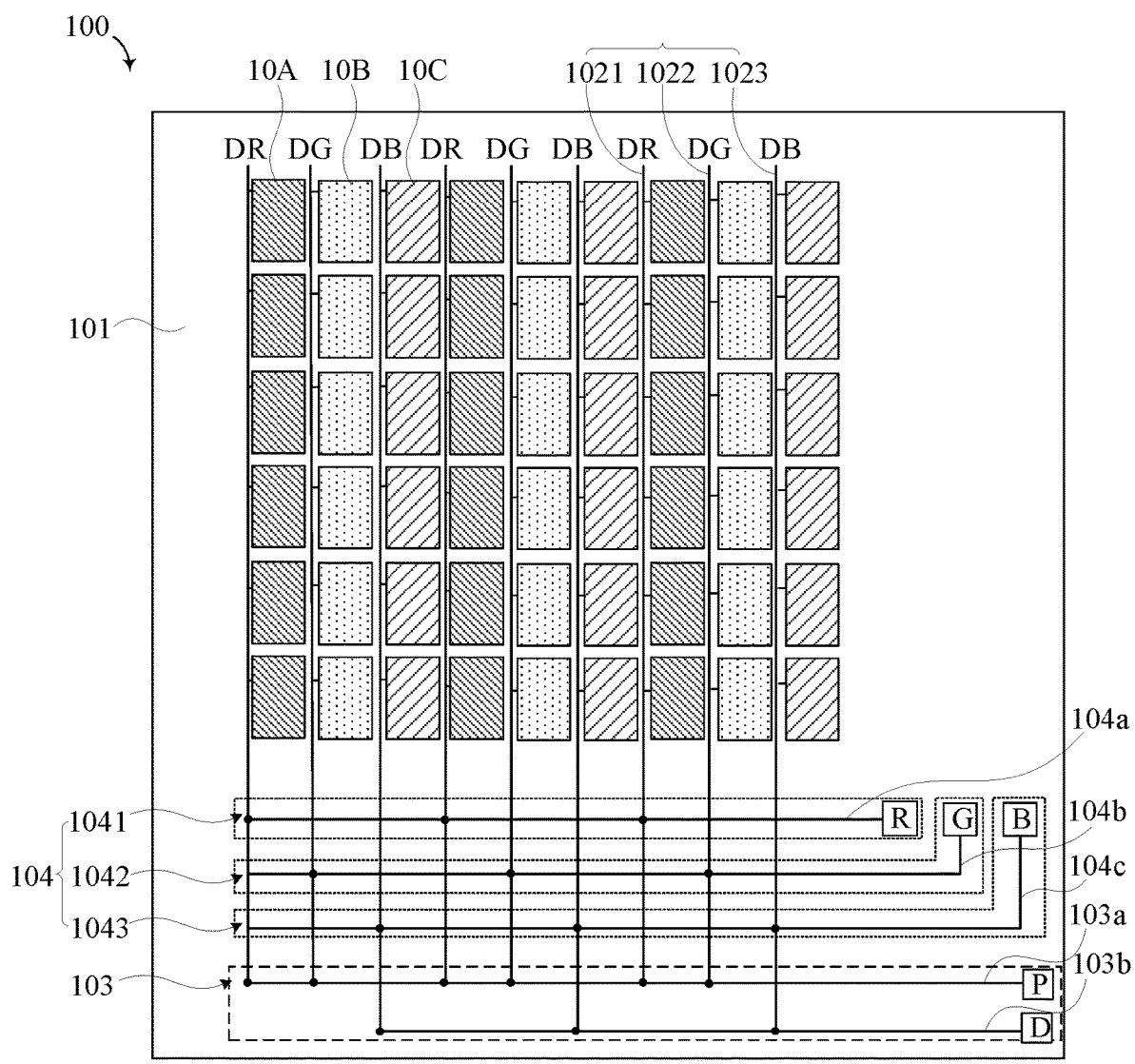
FIG. 2 is a second schematic structural view of the display panel provided by the embodiment of the present application.

Optionally, With reference to FIG. 2. FIG. 2 is a second schematic structural view of the display panel provided by the embodiment of the present application. A difference of the embodiment as shown in FIG. 2 from the embodiment as shown in FIG. 1 is that the first test module 103 is connected to signal lines for controlling two of these three color pixels to emit light. Another first test module 103 can be connected to a signal line for controlling the other of the three color pixels to emit light.

In detail, the display panel 100 further includes third color pixels 10C. The signal lines 102 further includes a plurality of third signal lines 1023. The third signal lines 1023 are connected to the third color pixels 10C. The first test module 103 further includes a second shorting bar 103b and a second soldering pad D. An end of the second shorting bar 103b is connected to the third signal lines 1023. Another end of the second shorting bar 103b is connected to the second soldering pad D.

Optionally, with further reference to FIG. 1. the display panel 100 further includes third color pixels 10C. The signal lines 102 further includes third signal lines 1023. The third signal lines 1023 are connected to the third color pixels 10C, and the first test module 103 is connected to at least two types of the first signal lines 1021, the second signal lines 1022, and the third signal lines 1023.

Optionally, the first color pixels 10A are blue pixels, the second color pixels 10B are red pixels, the third color pixels 10C are green pixels. Alternatively, the first color pixels 10A are red pixels, the second color pixels 10B are green pixels, and the third color pixels 10C are blue pixels. Alternatively, the first color pixels 10A are green pixels, the second color pixels 10B are blue pixels, and the third color pixels 10C are red pixels. The first test module 103 is connected to at least two types of the first signal lines 1021, the second signal lines 1022, and the third signal lines 1023. Namely, the first test module 103 is connected to at least two types of signal lines controlling the red pixel, the blue pixels, and the green pixels to emit light.

FIG. 1 is used as an example, the first color pixels 10A are red pixels, the second color pixels 10B are green pixels, the third color pixels 10C are blue pixels. Accordingly, for example, the first signal lines 1021 are red pixel data lines DR controlling a light emitting intensity of the red pixels, the second signal lines 1022 are green pixel data lines DG controlling a light emitting intensity of the green pixels, the third signal lines 1023 are blue pixel data lines DB controlling a light emitting intensity of the blue pixels.

In an embodiment, the first test module 103 is connected to the first signal lines 1021, the second signal lines 1022, and the third signal lines 1023. When the display panel 100 is a display panel with three color pixels mixing colors, for example, a RGB type display panel, The first test module 103 is connected to signal lines controlling these three color pixels to emit light. Such design prevents defects of the high missing probe rate and slow inspection speed of the AT inspection. Connecting the signal lines controlling the RGB pixels to emit light to one first test module 103 has a highest inspection efficiency. Also, a number of the probes and an alignment requirement of the AT inspection apparatus can be lowered accordingly, which prevents inaccuracy of the AT inspection.

Optionally, with further reference to FIG. 1. the first test module 103 further includes a first shorting bar 103*a*. An end of the first shorting bar 103*a* is electrically connected to the first signal lines 1021, the second signal lines 1022, and the third signal lines 1023. Another end of the first shorting bar 103*a* is connected to the first soldering pad P.

One shorting bar is connected to and shorts the first signal lines 1021, the second signal lines 1022, and the third signal lines 1023, and then a test signal is inputted into a thin film transistor array of the display panel 100 by the shorting bar. After the test is completed, the shorting bar is disconnected from the signal lines for later module assembling. The embodiment of the present application connects and shorts the first signal lines 1021, the second signal lines 1022, and the third signal lines 1023 by the first shorting bar 103*a* and connects them to a first soldering pad P (AT Pad). Such design can lower an alignment requirement to an inspection apparatus, increase alignment accuracy to further improve inspection accuracy. Therefore, the display panel 100 provided by the embodiment of the present application can test all of the signal lines 102 by one first soldering pad P and has a high inspection efficiency.

Optionally, the display panel 100 further includes a second test module 104, the second test module 104 is disposed on the underlay 101 and is disposed at intervals from the first test module 103 and the signal lines 102. The second test module 104 includes a first color test module 1041 and a second color test module 1042. The first color test module 1041 is connected to the first signal lines 1021. The second color test module 1042 is connected to the second signal lines 1022. The first test module 103 is disposed on a side of the second test module 104 away from the first color pixels 10A and the second color pixels 10B.

Optionally, with reference to FIG. 1, the second test module 104 further includes a third color test module 1043. The third color test module 1043 is connected to the third signal lines 1023.

Optionally, the first color test module 1041 includes a first color shorting bar 104*a* and a first color test soldering pad R. The second color test module 1042 includes a second color shorting bar 104*b* and a second color test soldering pad G. The third color test module 1043 includes a third color shorting bar 104*c* and a third color test soldering pad B.

It should be explained that FIG. 1 uses the first color pixels 10A being red pixels, the second color pixels 10B being green pixels, and the third color pixels 10C being blue pixels as an example. The first color test soldering pad is marked as R, the second color test soldering pad is marked as G, and the third color test soldering pad is marked as B.

An end of the first color shorting bar 104*a* is electrically connected to the first signal lines 1021, and another end of the first color shorting bar 104*a* is connected to the first color test soldering pad R. An end of the second color shorting bar 104*b* is electrically connected to the second signal lines 1022, and another end of the second color shorting bar 104*b* is connected to the second color test soldering pad G. An end of the third color shorting bar 104*c* is electrically connected to the third signal lines 1023, and another end of the third color shorting bar 104*c* is connected to the third color test soldering pad B.

During production of products, to raise a product yield rate, the liquid crystal display panel needs to implement an AT inspection after an array substrate is completed, and to implement a display panel cell test (CT) after a cell formation process. Accordingly, with reference to FIG. 1, during manufacturing of the display panel 100, before a cutting process is implemented, at this time, the display panels 100 are arranged in an array, the first soldering pad P and the first shorting bar 103*a* for the AT are disposed outside each of the display panels 100, the first color test soldering pad R, the second color test soldering pad G, the third color test soldering pad B for the CT, and the corresponding first color shorting bar 104*a*, second color shorting bar 104*b*, and third color shorting bar 104*c* are also disposed on a non-display region thereof. Namely, the first test module 103 is disposed on a side of the second test module 104 away from the first color pixels 10A and the second color pixels 10B.

After the AT is completed, the first soldering pad P and the first shorting bar 103*a* are cut and removed, and the first color test soldering pad R, the second color test soldering pad G, the third color test soldering pad B of the CT, and the corresponding first color shorting bar 104*a*, second color shorting bar 104*b*, and third color shorting bar 104*c*, due to their locations in the non-display region of the display panel 100, are deemed as internal structures of the display panel 100 and are preserved.

The first color test soldering pad R, the second color test soldering pad G, the third color test soldering pad B, and the corresponding first color shorting bar 104*a*, second color shorting bar 104*b*, and third color shorting bar 104*c* are connected to the first signal lines 1021, the second signal lines 1022, and the third signal lines 1023 respectively, and then in the test of the display panel, can individually test the signal lines of different colors.

In the process, test soldering pads are manufactured respectively in AT and CT processes. During the AT process, using none of the first color test soldering pad R, the second color test soldering pad G, and the third color test soldering pad B is to prevent the first color test soldering pad R, the second color test soldering pad G, and the third color test soldering pad B from damages during the AT process to result in poor contact or failure of the first color test soldering pad R, the second color test soldering pad G, and the third color test soldering pad B in the later CT process.

Figure 3:
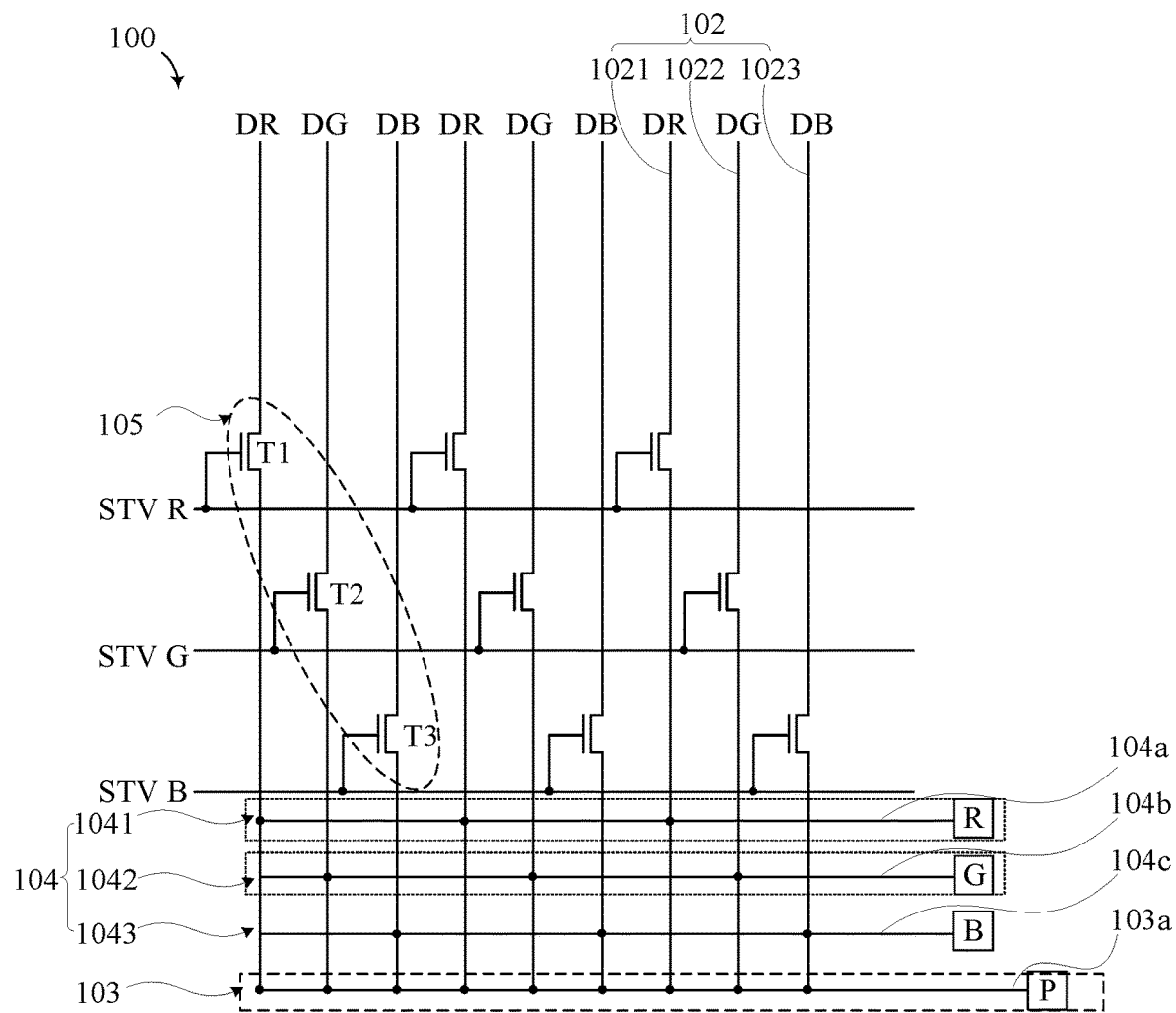
FIG. 3 is a third schematic structural view of the display panel provided by the embodiment of the present application.

Optionally, with reference to FIG. 3, FIG. 3 is a third schematic structural view of the display panel provided by the embodiment of the present application. The display panel 100 further includes a control module 105. The control module 105 is connected to the first signal lines 1021, the second signal lines 1022, and the third signal lines 1023. The control module 105 controls connection/disconnection of the first signal lines 1021, the second signal lines 1022, and the third signal lines 1023.

It should be explained that compared to the embodiment of FIG. 1, the same members are omitted in FIG. 3, and only main distinguishing members between the two embodiments are shown.

To guarantee a yield rate of the display panel 100, it is required to immediately light up the screen to perform an inspection after a process of the light emitting module is completed, which is called an electroluminescence (EL) inspection. At this time, no cutting operation is implemented to the display panels yet, the display panels are on a glass underlay of the same large board, the first shorting bar 103a is not cut off, and therefore the signal lines are still connected. The EL inspection requires a single red, blue, or green image to be lighted up individually to precisely inspect red, blue, or green light color and poor display condition. Therefore, the display panel 100 provided by the embodiment of the present application additionally includes a control module such that the EL inspection can be implemented before the first shorting bar 103a is cut off and separated. The control module 105 controls connection/disconnection of the first signal lines 1021, the second signal lines 1022, and the third signal lines 1023 to achieve a controllable single red, blue, or green color to simultaneously fulfill the AT and EL inspections.

In detail, the control module 105 includes a first thin film transistor T1, a second thin film transistor T2, and a third thin film transistor T3.

A gate electrode of the first thin film transistor T1 is configured to receive a first trigger signal STV R, a source electrode and a drain electrode of the first thin film transistor T1 are connected to the first signal lines 1021. A gate electrode of the second thin film transistor T2 is configured to receive a second trigger signal STV G. A source electrode and a drain electrode of the second thin film transistor T2 is connected to the second signal lines 1022. A gate electrode of the third thin film transistor T3 is configured to receive a third trigger signal SW B. A source electrode and a drain electrode of the third thin film transistor T3 is connected to the third signal lines 1023. The trigger signal (SW) can also be called initial signal, circuit activation signal, etc. The SW signal is used in the embodiment of the present application to control connection/disconnection of the first signal lines 1021, the second signal lines 1022, and the third signal lines 1023 to achieve a controllable single red, blue, or green color of the display panel 100 to simultaneously fulfill the AT and EL inspection.

In detail, the first trigger signal STV R, the second trigger signal STV G, and the third trigger signal SW B are inputted at different times to individually switch on the first thin film transistor T1, the second thin film transistor T2 and the third thin film transistor T3 to further control light emission of the first color pixels 10A, second color pixels B, and the third color pixels 10C.

The display panel 100 provided by the embodiment of the present application includes a control module 105. Designing a set of thin film transistor switches at distal ends of the signal lines 102 can break unnecessary signal lines for inspection during while an EL inspection is implemented, which achieves lighting-up of a single red, blue, or green color to complete the EL inspection. Such design, in one aspect, prevents a high missing probe rate of the AT inspection and a slow inspection speed due to the shorting bar inspection, and in another aspect, can fast and precisely implement an array inspection while not affecting later EL inspection, which can achieve individual activation of signal red, blue, or green lines and fulfill a two-step inspection.

Figure 4:
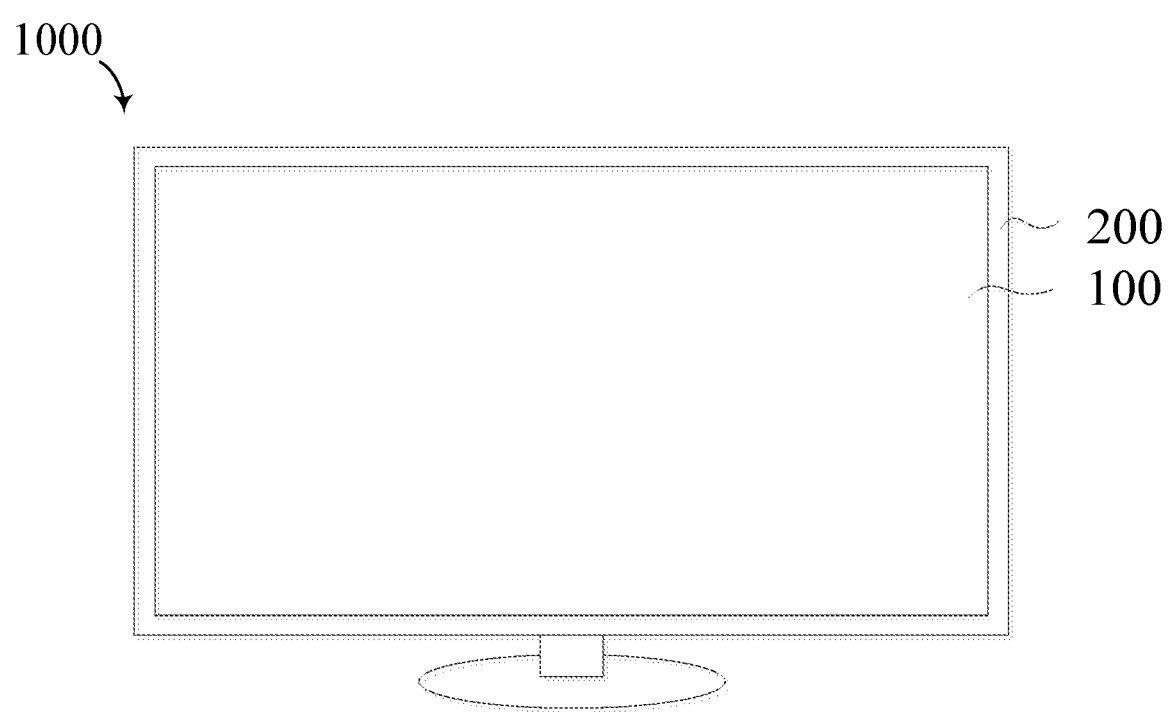
FIG. 4 is a schematic structural view of a display device provided by the embodiment of the present application.

Accordingly, the embodiment of the present application further provides a display device. With reference to FIG. 4, FIG. 4 is a schematic structural view of a display device provided by the embodiment of the present application. The display device 1000 includes a display panel 100 and an encapsulation structure 200. The display panel 100 is any one of the above display panels 100. The encapsulation structure 200 is disposed on the display panel 100.

It should be explained that display device 1000 can also include other device. Other device and equipment thereof are known by a person of ordinary skill in the art and would not be described repeatedly here.

The display device 1000 provided by the embodiment of the present application includes a display panel 100. In processes of the display panel 100, the display panel 100 includes an underlay, signal lines, a first test module, and a second test module. The signal lines are disposed on underlay. The signal lines include a plurality of first signal lines and a plurality of second signal lines. The first signal lines are connected to first color pixels. The second signal lines are connected to second color pixels. The first test module is disposed on underlay and is disposed at an interval from the signal lines. The first test module is connected to the first signal lines and the second signal lines. Because the first test module is connected to the first signal lines and the second signal lines, no individual tests for the first signal lines and second signal lines are required while the array test is implemented. As such, the number of the probes of the AT inspection apparatus can be reduced, and requirement for test probes and the test module can be lowered, which prevents inaccuracy of the AT inspection.

Accordingly, the embodiment of the present application also provides a display panel test method for testing any one of the above display panels. In detail, the display panel test method of the embodiment of the present application includes a step: implementing an array test by an array test soldering pad in a first test module to a display panel.

In detail, the display panel is still on a large board without cutting when an AT test is performed. A probe contact method through the first soldering pad P is used to perform an inspection.

The display panel test method further includes a step: implementing an electroluminescence test by the array test soldering pad in the first test module to the display panel.

In detail, after the light emitting layer process is completed, a screen is immediately controlled and lighted up to implement an electroluminescence (EL) test. At this time each display panel is still on a large board and is not processed with a cutting process yet. Therefore, the signal lines are still connected. A control module controls connection/disconnection of the first signal lines, the second signal lines, and the third signal lines 1023 such that the first color pixels, the second color pixels, and the third color pixels can be lighted up and tested by the array test soldering pad individually.

The display panel test method further includes a step: implementing a color test to the display panel by a first color test soldering pad in a second test module, a second color test soldering pad, and a third color test soldering pad.

When the display panel test method provided by the embodiment of the present application, while implanting the array test, needs no individual test for the first signal lines the second signal lines. Therefore, a number of probes of the array inspection apparatus can be reduced and requirement for test probes and the test module can be lowered, which prevents inaccuracy of the array inspection. Also, a control module can be used to satisfy the requirement of implementing an electroluminescence test by an array test soldering pad to achieve a controllable single color light emission of the display panel to implement an EL inspection before the first test module is cut, which guarantees a fast and accurate AT inspection without influencing a later EL inspection.

The display panel, the display panel test method, and the display device provided by the embodiment of the present application are described in detail as above. In the specification, the specific examples are used to explain the principle and embodiment of the present application. The above description of the embodiments is only used to help understand the method of the present application and its spiritual idea. Meanwhile, for those skilled in the art, according to the present idea of invention, changes will be made in specific embodiment and application. In summary, the contents of this specification should not be construed as limiting the present application.

What is claimed is:

1. A display panel, comprising first color pixels and second color pixels, wherein the display panel comprises:
   an underlay;
   signal lines disposed on the underlay, wherein the signal lines comprise a plurality of first signal lines and a plurality of second signal lines, the first signal lines are connected to the first color pixels, and the second signal lines are connected to the second color pixels; and
   a first test module disposed on the underlay, wherein the first test module comprises a first shorting bar and a first soldering pad, an end of the first shorting bar is connected to the first signal lines and the second signal lines, another end of the first shorting bar is connected to the first soldering pad, and the first test module is configured for an array test of the display panel;
   wherein the display panel further comprises third color pixels, the signal lines further comprise a plurality of third signal lines, the third signal lines are connected to the third color pixels, the first test module further comprises a second shorting bar and a second soldering pad, an end of the second shorting bar is connected to the third signal lines, and another end of the second shorting bar is connected to the second soldering pad;
   wherein each of the first signal lines, the second signal lines, and the third signal lines is connected to the same ones of the first, second, or third color pixels instead of being connected to color pixels in different colors.

2. The display panel according to claim 1, wherein the display panel further comprises a control module, the control module is connected to the first signal lines, the second signal lines, and the third signal lines, the control module is configured to control switching on/off of the first signal lines, the second signal lines, and the third signal lines.

3. The display panel according to claim 2, wherein the control module comprises a first thin film transistor, a second thin film transistor, and a third thin film transistor; and
   a gate electrode of the first thin film transistor is configured to receive a first trigger signal, a source electrode and a drain electrode of the first thin film transistor are connected to the first signal lines, a gate electrode of the second thin film transistor is configured to receive a second trigger signal, a source electrode and a drain electrode of the second thin film transistor are connected to the second signal lines, a gate electrode of the third thin film transistor is configured to receive a third trigger signal, and a source electrode and a drain electrode of the third thin film transistor are connected to the third signal lines.

4. The display panel according to claim 1, wherein the display panel further comprises a second test module, the second test module is disposed on the underlay and is disposed at an interval from the first test module, the second test module comprises a first color shorting bar, a first color test soldering pad, a second color shorting bar, and a second color test soldering pad, an end of the first color shorting bar is electrically connected to the first signal lines, another end of the first color shorting bar is connected to the first color test soldering pad, an end of the second color shorting bar is electrically connected to the second signal lines, another end of the second color shorting bar is connected to the second color test soldering pad, and the first test module is disposed on a side of the second test module away from the first color pixels and the second color pixels.

5. The display panel according to claim 4, wherein the second test module further comprises a third color shorting bar and a third color test soldering pad, an end of the third color shorting bar is electrically connected to the third signal lines, and another end of the third color shorting bar is connected to the third color test soldering pad.

6. The display panel according to claim 1, wherein the first color pixels are blue pixels, the second color pixels are red pixels, and the third color pixels are green pixels.

7. The display panel according to claim 1, wherein the first color pixels are red pixels, the second color pixels are green pixels, and the third color pixels are blue pixels.

8. The display panel according to claim 1, wherein the first color pixels are green pixels, the second color pixels are blue pixels, and the third color pixels are red pixels.

9. A display panel test method, configured to test the display panel according to claim 1, wherein the display panel test method comprises: implementing an array test to the display panel by an array test soldering pad in the first test module.

10. A display device, comprising a display panel and an encapsulation structure, wherein the display panel is the display panel according to claim 1, and the encapsulation structure is disposed on the display panel.

11. The display device according to claim 10, wherein the display panel further comprises a control module, the control module is connected to the first signal lines, the second signal lines and the third signal lines, the control module is configured to control switching on/off of the first signal lines, the second signal lines, and the third signal lines.

12. The display device according to claim 11, wherein the control module comprises a first thin film transistor, a second thin film transistor, and a third thin film transistor; and
   a gate electrode of the first thin film transistor is configured to receive a first trigger signal, a source electrode and a drain electrode of the first thin film transistor are connected to the first signal lines, a gate electrode of the second thin film transistor is configured to receive a second trigger signal, a source electrode and a drain electrode of the second thin film transistor are connected to the second signal lines, a gate electrode of the third thin film transistor is configured to receive a third trigger signal, and a source electrode and a drain electrode of the third thin film transistor are connected to the third signal lines.

13. The display device according to claim 10, wherein the display panel further comprises second test module, the second test module is disposed on the underlay and is disposed at an interval from the first test module, the second test module comprises a first color shorting bar, a first color test soldering pad, a second color shorting bar, and a second color test soldering pad, an end of the first color shorting bar is electrically connected to the first signal lines, another end of the first color shorting bar is connected to the first color test soldering pad, an end of the second color shorting bar is electrically connected to the second signal lines, another end of the second color shorting bar is connected to the second color test soldering pad, and the first test module is disposed on a side of the second test module away from the first color pixels and the second color pixels.

14. The display device according to claim 13, wherein the second test module further comprises a third color shorting bar and a third color test soldering pad, an end of the third color shorting bar is electrically connected to the third signal lines, and another end of the third color shorting bar is connected to the third color test soldering pad.

15. The display device according to claim 10, wherein the first color pixels are blue pixels, the second color pixels are red pixels, and the third color pixels are green pixels.

16. The display device according to claim 10, wherein the first color pixels are red pixels, the second color pixels are green pixels, and the third color pixels are blue pixels.

17. The display device according to claim 10, wherein the display panel further comprises third color pixels, the signal lines further comprise a plurality of third signal lines, the third signal lines are connected to the third color pixels, the first test module further comprises a second shorting bar and a second soldering pad, an end of the second shorting bar is connected to the third signal lines, and another end of the second shorting bar is connected to the second soldering pad.

* * * * *